(12) United States Patent
Nomura et al.

(10) Patent No.: US 12,469,797 B2
(45) Date of Patent: Nov. 11, 2025

(54) ELECTRONIC COMPONENT MODULE COMPRISING PLURALITY OF COMPONENTS AND SUBSTRATE INCLUDING INSULATING LAYER, GROUND LAYER AND GROUND BUMP

(71) Applicant: Murata Manufacturing Co., Ltd., Nagaokakyo (JP)

(72) Inventors: Tadashi Nomura, Nagaokakyo (JP); Toru Komatsu, Nagaokakyo (JP)

(73) Assignee: MURATA MANUFACTURING CO., LTD., Kyoto-Fu (JP)

( * ) Notice: Subject to any disclaimer, the term of this patent is extended or adjusted under 35 U.S.C. 154(b) by 398 days.

(21) Appl. No.: 18/184,734

(22) Filed: Mar. 16, 2023

(65) Prior Publication Data
US 2023/0223355 A1 Jul. 13, 2023

Related U.S. Application Data (63) Continuation of application No. PCT/JP2021/034370, filed on Sep. 17, 2021.

(30) Foreign Application Priority Data

Sep. 25, 2020 (JP) .................... 2020-160702

(51) Int. Cl.
*H01L 23/552* (2006.01)
*H01L 21/56* (2006.01)
(Continued)

(52) U.S. Cl.
CPC .......... *H01L 23/552* (2013.01); *H01L 21/561* (2013.01); *H01L 25/16* (2013.01);
(Continued)

(58) Field of Classification Search
CPC . H01L 23/552; H01L 21/568; H01L 23/3128; H01L 25/0655; H01L 25/16;
(Continued)

(56) References Cited

U.S. PATENT DOCUMENTS

| 10,418,341 B2 | 9/2019 | Jung et al. |
| 2004/0119162 A1* | 6/2004 | Egawa ............ H01L 24/97 257/734 |

(Continued)

FOREIGN PATENT DOCUMENTS

| JP | 2001-298102 A | 10/2001 |
| JP | 2004-207378 A | 7/2004 |
| JP | 2012-059832 A | 3/2012 |

OTHER PUBLICATIONS

International Search Report for PCT/JP2021/034370 dated Nov. 30, 2021.

*Primary Examiner* — Didarul A Mazumder
(74) *Attorney, Agent, or Firm* — McDonald Hopkins LLC (57) ABSTRACT

An electronic component module includes a plurality of components including a terminal and placed along a plane, a frame substrate supporting at least some components among the plurality of components, a sealing resin portion sealing the plurality of components and the frame substrate, and a shield layer covering an outer surface of the sealing resin portion. The frame substrate includes an insulating layer, a ground layer, and a ground bump electrically connected to the ground layer, and also an opening supporting a portion other than solder bumps of bump components, and the ground layer of the frame substrate is exposed to a side surface of the frame substrate and is electrically connected to the shield layer. The terminal of the plurality of components and the ground bump are exposed while protruding
(Continued)

from a plane of the sealing resin portion and are used as mounting terminals of the electronic component module.

18 Claims, 12 Drawing Sheets

(51) Int. Cl.
    *H01L 23/00*     (2006.01)
    *H01L 23/13*     (2006.01)
    *H01L 25/16*     (2023.01)

(52) U.S. Cl.
    CPC ............ *H01L 21/568* (2013.01); *H01L 23/13* (2013.01); *H01L 24/16* (2013.01); *H01L 2224/16227* (2013.01)

(58) Field of Classification Search
    CPC ............. H01L 21/561; H01L 24/16–17; H01L 25/165; H01L 2224/16227
    USPC ......................................................... 257/659
    See application file for complete search history.

(56) References Cited

U.S. PATENT DOCUMENTS

| | | | |
|---|---|---|---|
| 2012/0056292 A1 | 3/2012 | Suzuki et al. | |
| 2018/0061806 A1* | 3/2018 | Jung | ........................ H01L 24/96 |
| 2018/0158779 A1* | 6/2018 | Yang | ................... H01L 21/4853 |
| 2020/0251459 A1* | 8/2020 | Tsuda | ...................... H01L 23/66 |

* cited by examiner

[COMPONENT PLACING STEP]

Fig.3A

[TEMPORARY SEALING STEP]

[RESIN SEALING STEP]

Fig.4A

[ADHESIVE SHEET PEELING STEP]

Fig.4B

[TEMPORARY SEALING MATERIAL REMOVING STEP]

Fig.4C

[SHIELD LAYER FORMING STEP]

[TEMPORARY SEALING STEP]

ELECTRONIC COMPONENT MODULE COMPRISING PLURALITY OF COMPONENTS AND SUBSTRATE INCLUDING INSULATING LAYER, GROUND LAYER AND GROUND BUMP

CROSS REFERENCE TO RELATED APPLICATION

This is a continuation of International Application No. PCT/JP2021/034370 filed on Sep. 17, 2021 which claims priority from Japanese Patent Application No. 2020-160702 filed on Sep. 25, 2020. The contents of these applications are incorporated herein by reference in their entireties.

BACKGROUND OF THE DISCLOSURE

Field of the Disclosure

The present disclosure relates to an electronic component module configured by including a plurality of components, and a method of manufacturing such an electronic component module.

Description of the Related Art

Patent Literature 1 discloses an electronic component module that includes no wiring substrate, causes a tip of a bump of each component to protrude from a sealing resin, and is mostly embedded in the sealing resin. According to this structure, a thickness and a weight are able to be reduced more than before.

[Patent Literature 1] U.S. Pat. No. 10,418,341

BRIEF SUMMARY OF THE DISCLOSURE

Figure 12:
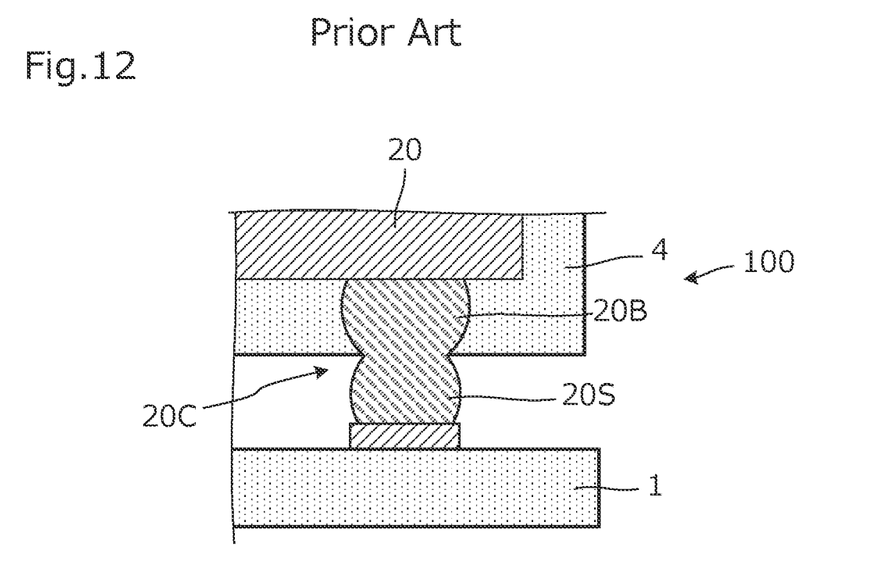
FIG. 12 is a partial cross-sectional view of a state in which a constricted portion 20C is formed at a bump when an electronic component module is mounted on a mounting board while a large portion of a solder bump 20B of a bump component 20 is fixed in shape by a sealing resin portion 4.

In the electronic component module disclosed in Patent Literature 1, most of the bump of each component is fixed in shape by a sealing resin portion, so that, when the electronic component module is mounted on a mounting board, a constricted portion is formed in the bump. The state is shown in FIG. 12 as a partial cross-sectional plan view. In FIG. 12, a bump component 20 is sealed by a sealing resin portion 4. When this electronic component module 100 is connected to a mounting board 1 through connecting solder 20S, a constricted portion 20C is formed between a solder bump 20B and the connecting solder 20S. Therefore, after the electronic component module 100 is mounted on the mounting board 1, strain stress generated between the mounting board 1 and the electronic component module 100 is concentrated on the constricted portion 20C, and a crack easily occurs in such a portion. In other words, there is a problem that the reliability of a connecting portion of the solder bump is low.

In view of the foregoing, the present disclosure is directed to provide an electronic component module that increases the reliability of a bump connecting portion of a bump component, and a method of manufacturing such an electronic component module.

(1) An electronic component module as an example of the present disclosure includes a plurality of components each of which includes a terminal, a substrate that supports at least some components among the plurality of components, a sealing resin portion that seals the plurality of components and the substrate, and a shield layer that covers an outer surface of the sealing resin portion, and the plurality of components include a bump component that includes a bump as the terminal, the substrate includes an insulating layer, a ground layer, and a ground bump that is electrically connected to the ground layer, the substrate includes an opening that supports a portion other than the bump of the bump component, the ground layer of the substrate is exposed to a side surface of the substrate, and is electrically connected to the shield layer, the terminal of the plurality of components and the ground bump are exposed while protruding from the sealing resin portion, and the terminal of the plurality of components and the ground bump that protrude from the sealing resin portion are used as mounting terminals of the electronic component module.

The above structure, since requiring no connecting solder and enabling direct connection to an electrode of a mounting board by the bump of the components, generates no constricted portion between the bump of the components and the connecting solder.

(2) A method of manufacturing an electronic component module as an example of the present disclosure includes a component placing step of causing a substrate including an opening to make the opening support a component that causes a terminal to protrude from the opening, and placing the substrate that supports the component, and a chip component that includes a terminal on both ends, on an adhesive sheet, a temporary sealing step of sealing the opening of the substrate by a temporary sealing material, a resin sealing step of sealing with a resin a periphery of the plurality of components on the adhesive sheet, and forming a sealing resin portion, an adhesive sheet peeling step of peeling the adhesive sheet from the sealing resin portion and exposing the terminal of the plurality of components to a surface from which the adhesive sheet is peeled, a temporary sealing material removing step of removing the temporary sealing material, a shield layer forming step of forming a shield layer on a surface of the sealing resin portion, and a piece dividing step of cutting and dividing the sealing resin portion into individual pieces.

According to such a manufacturing method, the bump of the bump component is able to be easily protruded from a surface on which the bump is formed.

According to the present disclosure, an electronic component module that increases reliability of a bump connecting portion of a bump component is able to be obtained.

DETAILED DESCRIPTION OF THE DISCLOSURE

Hereinafter, a plurality of exemplary embodiments of the present disclosure will be described with reference to the attached drawings and several specific examples. In the drawings, components and elements assigned with the same reference numerals or symbols will represent identical or substantially identical components and elements. While the plurality of exemplary embodiments of the present disclosure are divided into a group of exemplary embodiments and described for the sake of convenience in consideration of ease of description or understanding of main points, constituent elements described in different exemplary embodiments are able to be partially replaced and combined with each other. In the second and subsequent exemplary embodiments, a description of matters common to the first exemplary embodiment will be omitted and only different points will be described. In particular, the same advantageous functions and effects by the same configurations will not be described one by one for each exemplary embodiment.

First Exemplary Embodiment

Figure 1A:
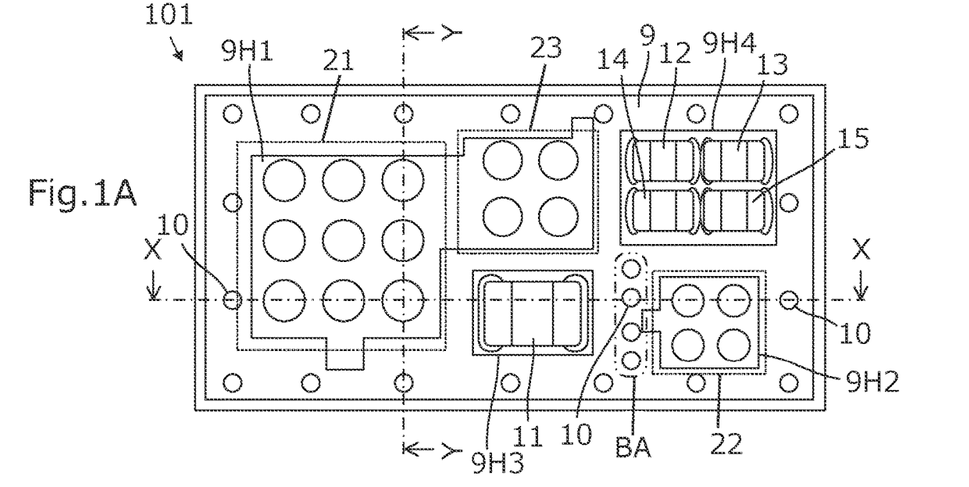
FIG. 1A is a bottom view of an electronic component module 101 according to a first exemplary embodiment.
Figure 1B:
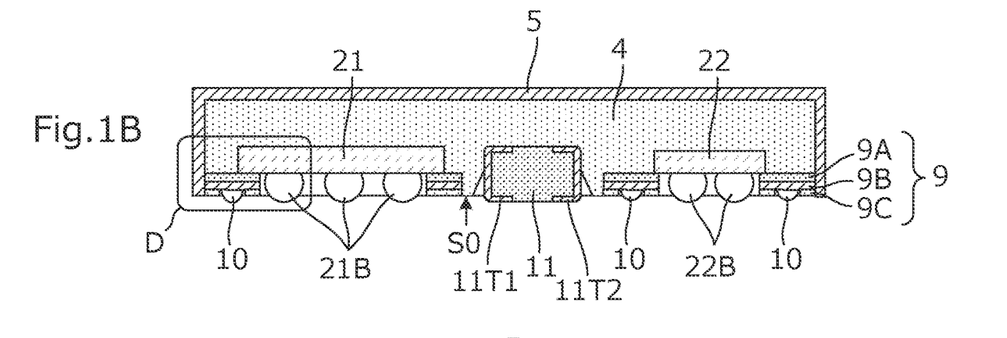
FIG. 1B is a cross-sectional view of an X-X portion in FIG. 1A.
Figure 1C:
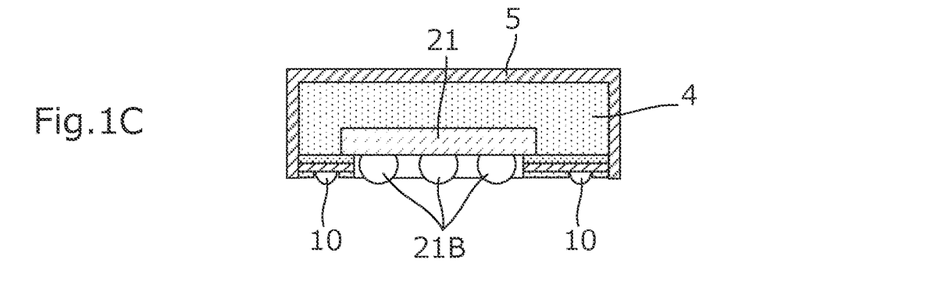
FIG. 1C is a cross-sectional view of a Y-Y portion in FIG. 1A.
Figure 1D:
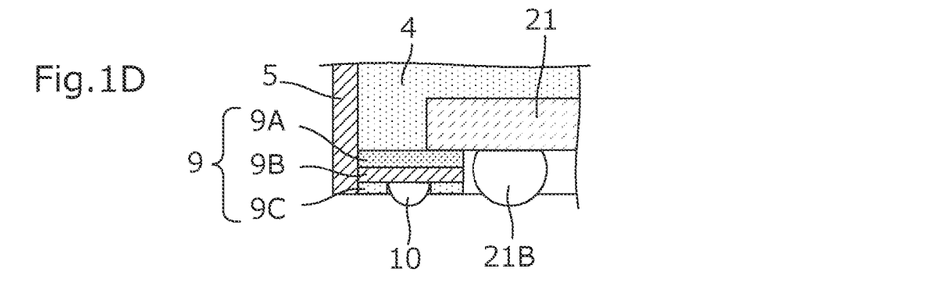
FIG. 1D is an enlarged view of a D portion in FIG. 1B.

FIG. 1A is a bottom view of an electronic component module 101 according to a first exemplary embodiment, FIG. 1B is a cross-sectional view of an X-X portion in FIG. 1A, and FIG. 1C is a cross-sectional view of a Y-Y portion in FIG. 1A. FIG. 1D is an enlarged view of a D portion in FIG. 1B.

The electronic component module 101 includes a plurality of components that each include a terminal and are placed along a plane, a frame substrate 9 that supports at least some components among the plurality of components, a sealing resin portion 4 that seals the plurality of components and a substrate, and a shield layer 5 that covers an outer surface of the sealing resin portion 4.

The electronic component module 101 includes bump components 21, 22, and 23 that include a bump as a terminal. The bump component 21 includes nine solder bumps 21B, and the bump component 22 includes four solder bumps 22B. In addition, the bump component 23 includes four solder bumps.

Moreover, the electronic component module 101 includes chip components 11, 12, 13, 14, and 15 in which a terminal is formed on each of both ends. The chip component 11 includes terminals 11T1 and 11T2 on both ends.

The frame substrate 9 includes openings 9H1, 9H2, 9H3, and 9H4. The opening 9H1 supports a periphery of the bump components 21 and 23, and the opening 9H2 supports a periphery of the bump component 22.

The sealing resin portion 4 seals the chip components 11 to 15 and the frame substrate 9. The chip component 11, although being located in the opening 9H3 of the frame substrate 9, is not supported by the frame substrate 9. Similarly, the chip components 12 to 15, although being located in the opening 9H4 of the frame substrate 9, are not supported by the frame substrate 9.

The chip components 11 to 15 are, for example, chip resistors, chip capacitors, chip inductors, or the like, and the bump components 21, 22, and 23 are, for example, SAW filters, semiconductor chips, or the like. The chip components 11 to 15 also include components such as LC filters in which a capacitor, an inductor, or the like is formed in a ceramic body, and land grid array components in which an electrode terminal is placed only on a bottom surface of the components. The bump components also include bump grid array components in which a bump terminal is placed only on a bottom surface of the components.

The frame substrate 9 includes an insulating layer 9A, a ground layer 9B, and a resist layer 9C. The ground layer 9B is exposed to a side surface of the frame substrate 9, and is electrically connected to the shield layer 5. In addition, a ground bump 10 is formed in an exposed portion in which the resist layer 9C is not formed.

The ground bump 10 is placed at a location along four side portions of the sealing resin portion 4 of the electronic component module 101. Moreover, a ground bump array BA by a plurality of ground bumps 10 is formed between the chip component 11 and the bump component 22. A ground bump 10 of the ground bump array BA is located between the chip component 11 and the bump component 22 and between the bump component 23 and the bump component 22. Therefore, the chip component 11 and the bump component 22 are electromagnetically shielded by the ground bump array BA. Similarly, the bump component 23 and the bump component 22 are electromagnetically shielded by the ground bump array BA.

The shield layer 5 may be a metal film formed by sputtering, plating, or the like, and may be configured by stacking a plurality of layers made of a plurality of types of metals. The shield layer 5 has a three-layered structure of a cohesive layer, a conductive layer, and a rust-prevention layer, for example, sequentially from the sealing resin portion 4. The function and characteristics of each layer are as follows.

[Cohesive Layer]
 The shield layer 5 is closely contacted to the sealing resin portion 4.
 A thickness of the cohesive layer is smaller than a thickness of the conductive layer. For example, Ti, Cr, stainless steel (SUS), or the like is able to be used.
[Conductive Layer]
 Electromagnetic interference waves are shielded.
 A metal having high electrical conductivity makes configuration, and the thickness is larger than the thickness of the cohesive layer and the rust-prevention layer (shield performance is determined by the conductive layer). For example, copper (Cu), silver (Ag), aluminum (Al), or the like is able to be used.
[Rust-Prevention Layer]
 Oxidation or corrosion of the conductive layer is prevented.
 The thickness of the rust-prevention layer has several hundreds of nm to several μm, and is smaller than the thickness of the conductive layer. For example, Ti, Cr, stainless steel (SUS), or the like is able to be used.

Figure 2:
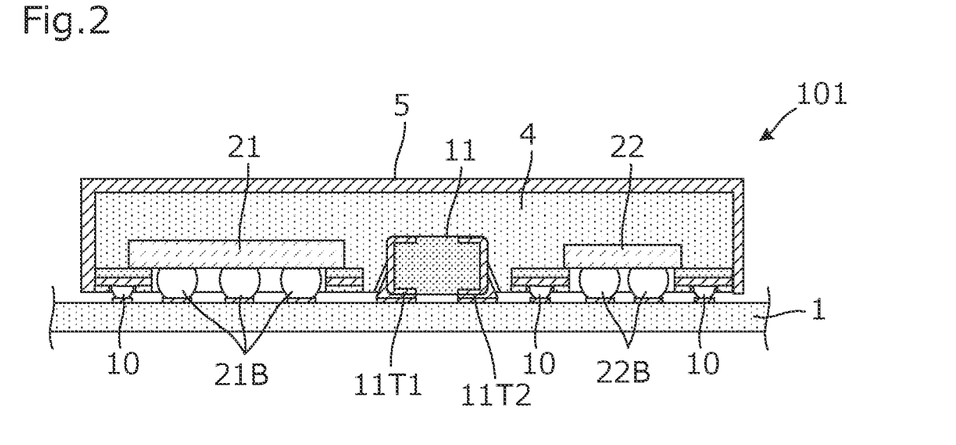
FIG. 2 is a cross-sectional view in a state in which the electronic component module 101 is mounted on a mounting board.

FIG. 2 is a cross-sectional view in a state in which the electronic component module 101 is mounted on a mounting board 1. An electrode for mounting the electronic component module 101 is formed on the mounting board 1. The terminals (the solder bumps 21B and 22B, the terminal 11T1, 11T2, or the like) of the plurality of components of the electronic component module 101 and the ground bump 10 are exposed while protruding from a plane of the sealing resin portion 4.

As shown in FIG. 2, the terminals of the plurality of components protruding from the plane of the sealing resin portion 4 of the electronic component module 101 are connected to the electrode of the mounting board 1, respectively. The terminal 11T1 and the terminal 11T2 are connected to the electrode of the mounting board 1 through a conductive member such as solder. The conductive member enters the opening 9H3 (see FIG. 1A) of the chip component 11, that is formed in the sealing resin portion 4. Then, proper setting of the depth and space of the opening 9H3 is able to adjust wet rise or wet spread of the conductive member.

In such a manner, the terminals of the plurality of components protruding from the plane of the sealing resin portion 4 of the electronic component module 101 are directly used as mounting terminals of the electronic component module 101. The mounting board 1 is configured by a millimeter-wave antenna or a millimeter-wave circuit, for example, and the electronic component module 101 is a millimeter-wave circuit module.

Subsequently, a method of manufacturing the electronic component module 101 will be described.

FIG. 3A to FIG. 5C are views showing each step of the method of manufacturing the electronic component module 101. Each step will be described with reference to these drawings.

Figure 3A:
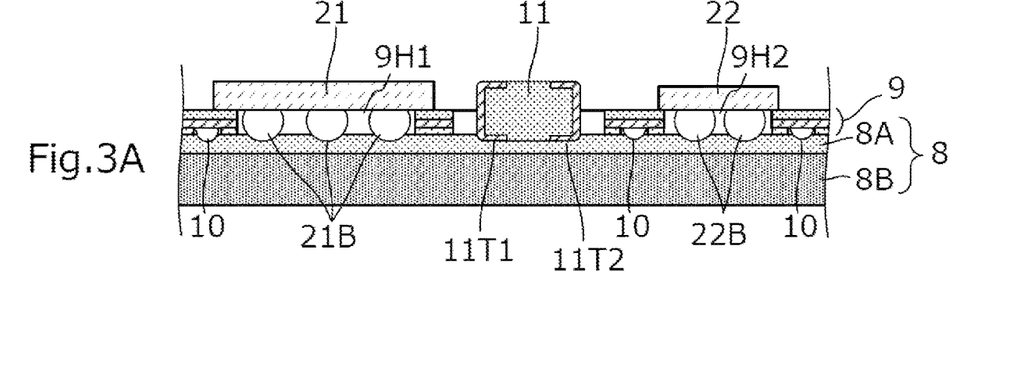
FIG. 3A is a cross-sectional view of the electronic component module 101 in a component placing step.

[Component Placing Step]
 As shown in FIG. 3A, a plurality of predetermined components are placed in an array on an adhesive sheet 8. The adhesive sheet 8 is configured by a base material 8B, and an adhesive layer 8A that covers a surface of the base material 8B. The base material 8B is, for example, an inorganic oxide such as glass or ceramic, or an organic material such as an epoxy resin, and the adhesive layer 8A is, for example, a rubber-based adhesive agent, an acrylic-based adhesive agent, and a silicone-based adhesive agent.

First, the frame substrate 9 is mounted on the adhesive sheet 8. Subsequently, a predetermined component is placed in each opening of the frame substrate 9. Accordingly, the solder bump 21B of the bump component 21 is bonded to the adhesive layer 8A, the solder bump 22B of the bump component 22 is bonded to the adhesive layer 8A, and the chip component 11 is bonded to the adhesive layer 8A. In such a state, the bump components 21 and 22 are supported by a periphery of the opening of the frame substrate 9. In other words, a predetermined space (a standoff) is formed between the surface of the bump component 21 on which the bump is formed, and the adhesive layer 8A. Similarly, a predetermined space (a standoff) is formed between the surface of the bump component 22 on which the bump is formed, and the adhesive layer 8A.

Figure 3B:
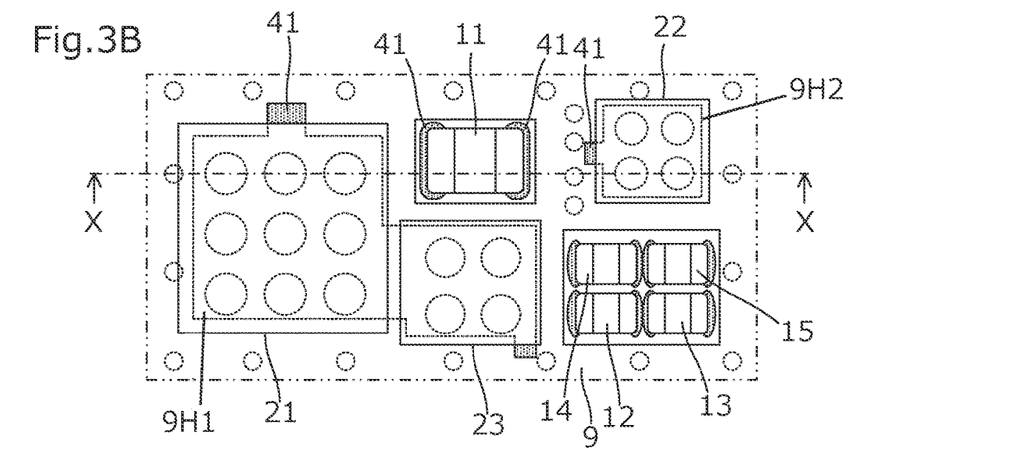
FIG. 3B is a plan view of the electronic component module 101 in a temporary sealing step.
Figure 3C:
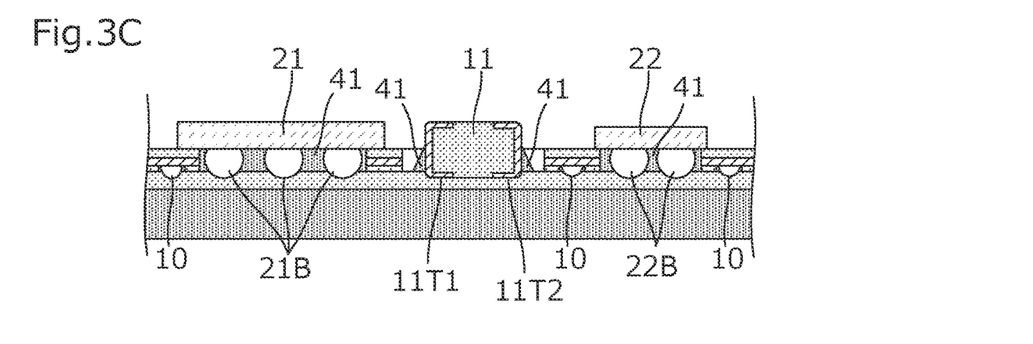
FIG. 3C is a cross-sectional view of an X-X portion in FIG. 3B.

[Temporary Sealing Step]
 FIG. 3B is a plan view of the electronic component module in the temporary sealing step, and FIG. 3C is a cross-sectional view of an X-X portion in FIG. 3B.
 In the temporary sealing step, the openings 9H1 and 9H2 of the frame substrate 9 are sealed by a temporary sealing material 41. In addition, the temporary sealing material 41 is applied to terminals of the chip components 11 to 15. The temporary sealing material 41 is, for example, a photoresist material water-soluble resin. The temporary sealing material 41, after being applied, is cured by UV irradiation, heat, or the like.

Figure 4A:
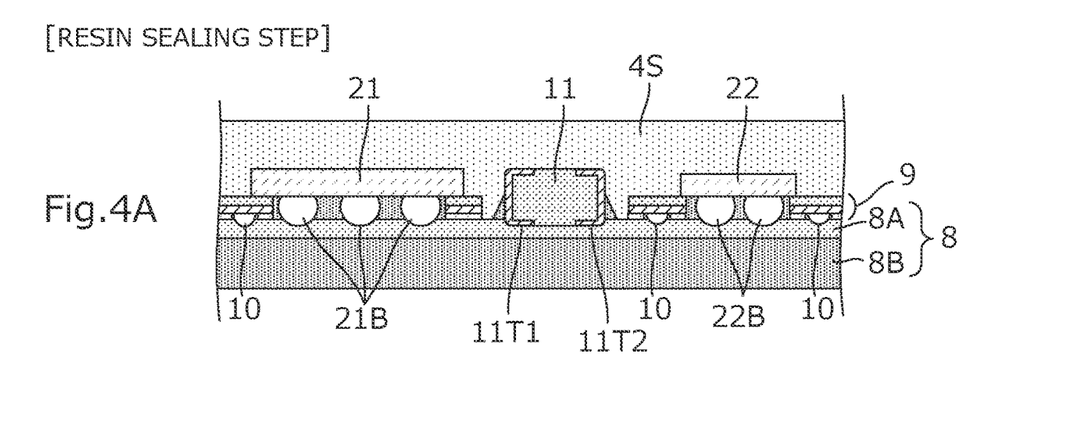
FIG. 4A is a cross-sectional view of the electronic component module 101 in a resin sealing step.

[Temporary Sealing Step]
 As shown in FIG. 4A, the sealing resin layer 4S is covered on the adhesive sheet 8. As a result, the sealing resin layer 4S seals with a resin a periphery of the plurality of components on the frame substrate 9 and the adhesive sheet 8. The sealing resin layer 4S is, for example, an epoxy resin containing silica filler, or the like, and performs covering by using a method such as applying liquid resin and compression molding. Subsequently, the sealing resin layer 4S, after being solidified, is changed into the sealing resin portion 4.

Figure 4B:
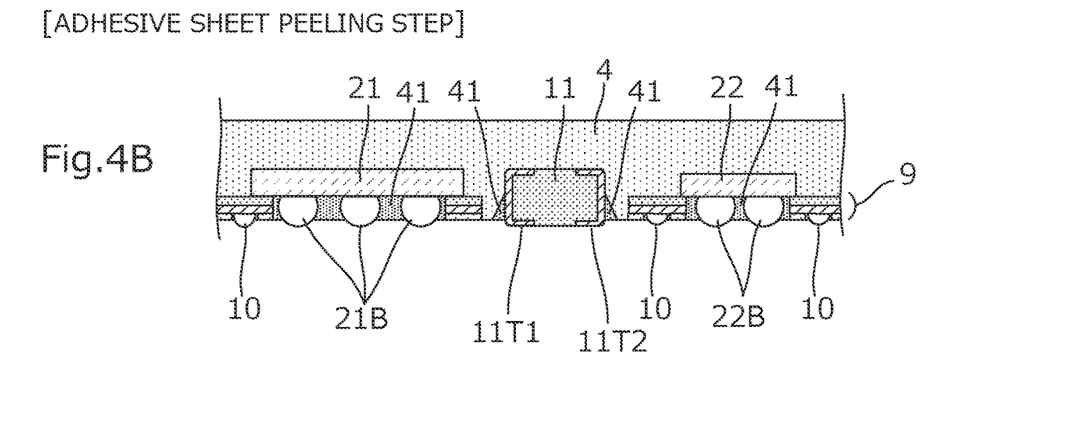
FIG. 4B is a cross-sectional view of the electronic component module 101 in an adhesive sheet peeling step.

[Adhesive Sheet Peeling Step]
 As shown in FIG. 4B, the adhesive sheet 8 is peeled from the sealing resin portion 4. As a result, the terminals of the plurality of components are exposed to the surface of the sealing resin portion 4 from which the adhesive sheet 8 is peeled. For example, the solder bump 21B of the bump component 21 is exposed, the solder bump 22B of the bump component 22 is exposed, and the terminals 11T1 and 11T2 of the chip component 11 are exposed.

Figure 4C:
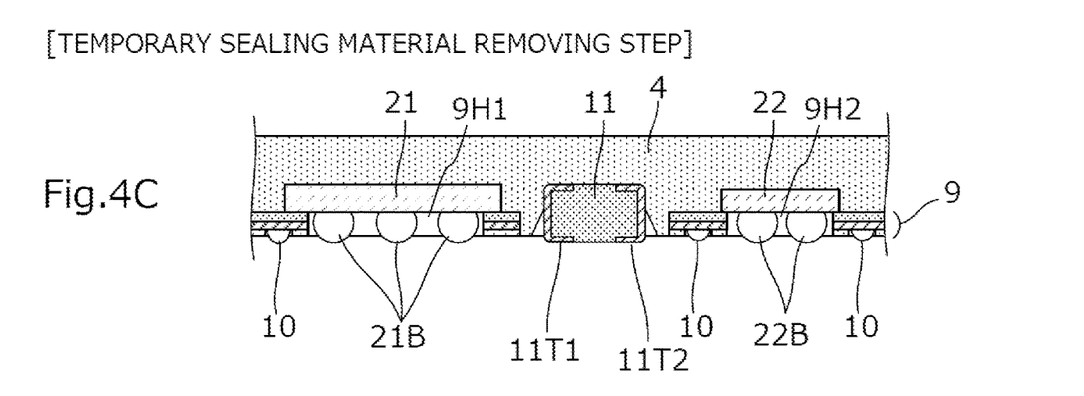
FIG. 4C is a cross-sectional view of the electronic component module 101 in a temporary sealing material removing step.

[Temporary Sealing Material Removing Step]
 As shown in FIG. 4C, the temporary sealing material 41 in the openings 9H1 and 9H2 of the frame substrate 9 is removed. In addition, the temporary sealing material 41 adhered to the terminals of the chip components 11 to 15 is removed. The temporary sealing material 41, in a case of being a water-soluble resin, is removed with water, and in a case of being a photoresist material, is removed by an alkaline aqueous solution or an organic solvent such as acetone.

Figure 5A:
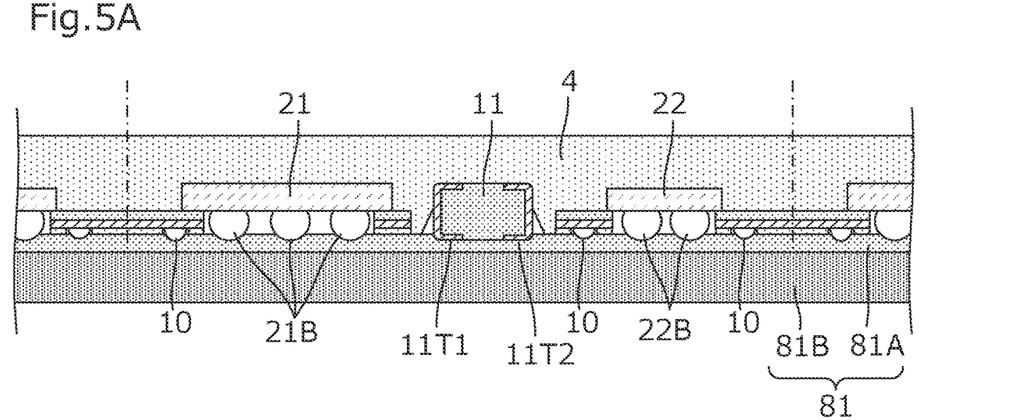
FIG. 5A, FIG. 5B, and FIG. 5C are cross-sectional views of the electronic component module 101 in a shield layer forming step.
Figure 5B:
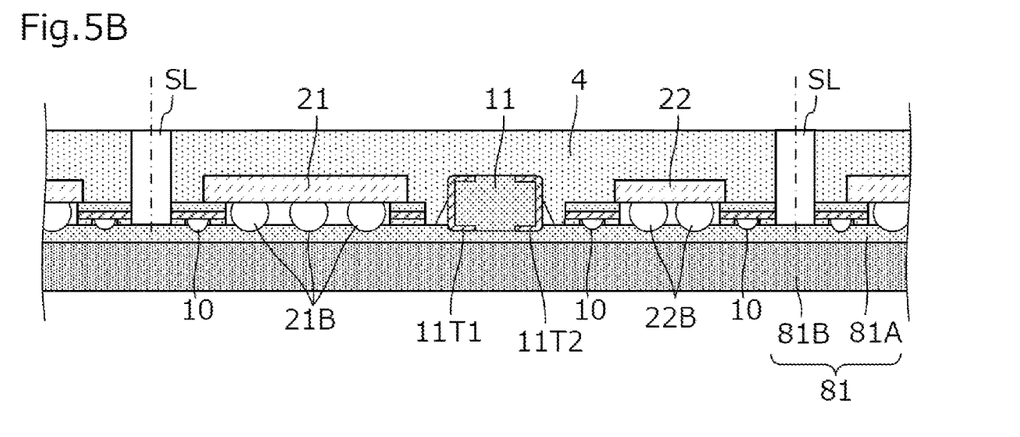
Figure 5C:
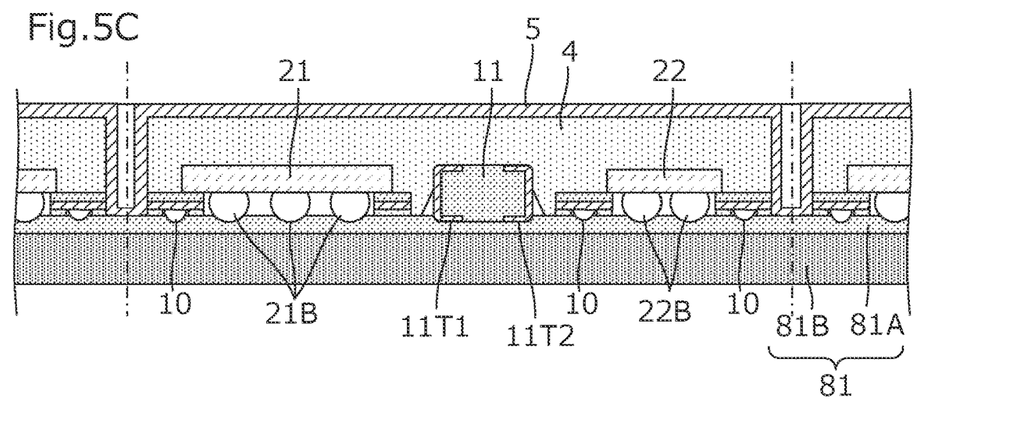

[Shield Layer Forming Step]
 First, as shown in FIG. 5A, the sheet from which the above temporary sealing material 41 is removed is attached on a dicing tape 81.
 Subsequently, as shown in FIG. 5B, a slit SL is formed at a portion (a periphery of the electronic component module 101 as a unit) that is later divided into individual pieces, and as shown in FIG. 5C, the shield layer 5 is formed on the surface of the sealing resin portion 4. First, stainless steel (SUS) is formed on the surface of the sealing resin portion 4 by sputtering or the like, as a cohesive layer. Subsequently, copper (Cu) is formed by sputtering or the like, as a conductive layer, on a surface of the cohesive layer. Furthermore, stainless steel (SUS) is formed by sputtering or the like, as a rust-prevention layer, on a surface of the conductive layer.

[Piece Dividing Step]

The dicing tape 81 is cut at a dashed-dotted line portion shown in FIG. 5C and separated into individual pieces in a unit of electronic component module. Subsequently, the dicing tape 81 is peeled off, so that the electronic component module 101 shown in FIG. 1A and FIG. 1B is obtained.

According to the above steps, the electronic component module 101 is manufactured.

In the example shown above, the shield layer 5, although being formed before being divided into individual pieces, may be formed after being divided into individual pieces.

It is to be noted that, before the adhesive sheet peeling step, information on the electronic component module may be printed on the top surface of the sealing resin portion 4, as necessary.

According to the present exemplary embodiment, the following functional and advantageous effects are obtained.

(1) No connecting solder is required, and the bump of the components is directly connected to the electrode of the mounting board, so that no constricted portion between the bump of the components and the connecting solder is generated. Therefore, an electronic component module that increases reliability of a bump connecting portion of a bump component is able to be obtained.

(2) An area around the bump of the bump component is hollow, and has a low dielectric constant, so that a transmission loss in a millimeter wave band is able to be reduced.

(3) A part of the frame substrate 9 is inserted under the bump components 21 and 22, so that the distance (the standoff) from the plane S0 of the electronic component module 101 to the surface of the bump components 21 and 22 on which the bump is formed is able to be stabilized.

(4) The frame substrate 9 is placed between the components that electromagnetically interfere with each other, so that an electromagnetic shield between such components is made. In addition, the ground bump 10 is placed, so that the shield property is further improved.

(5) Compared with an electronic component module of a structure in which the plurality of components are mounted on an interposer and a top portion of the interposer is sealed with a resin, such an interposer is unnecessary, so that an electronic component module with an overall low height is able to be configured.

(6) A space between the plane S0 of the electronic component module 101 and the mounting board 1 is properly maintained over the entire surface, so that the solder bond quality by solder mounting to the electrode of the mounting board 1 is high.

(7) A gap between the mounting board 1 and the electronic component module 101 is properly maintained, so that the space between the mounting board 1 and the electronic component module 101 is able to be fully washed.

(8) The gap between the mounting board 1 and the electronic component module 101 is properly maintained, so that, when the space between the mounting board 1 and the electronic component module 101 is filled with a resin, the filling property of the resin is high.

Second Exemplary Embodiment

In a second exemplary embodiment, an electronic component module including a conductive element that is electrically connected to a ground bump will be described.

Figure 6A:
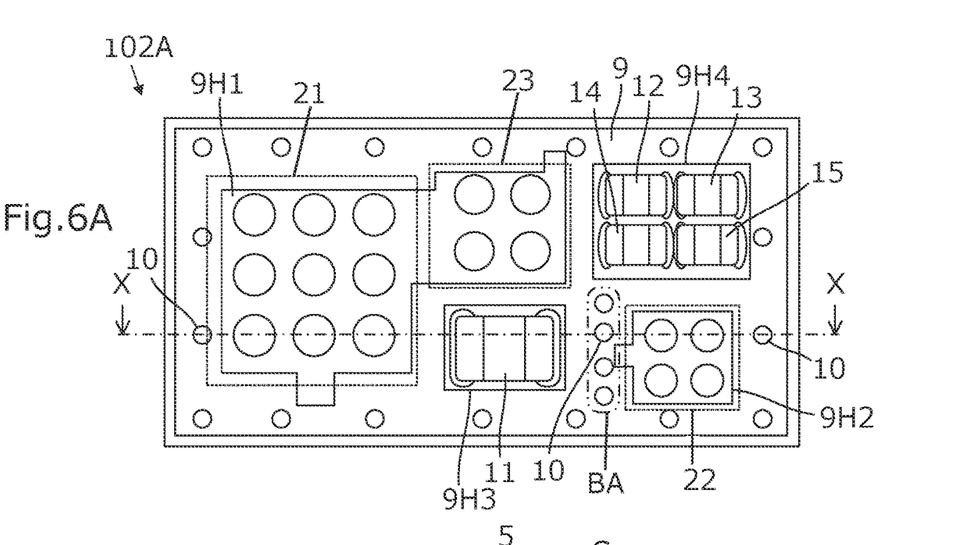
FIG. 6A is a bottom view of an electronic component module 102A according to a second exemplary embodiment.
Figure 6B:
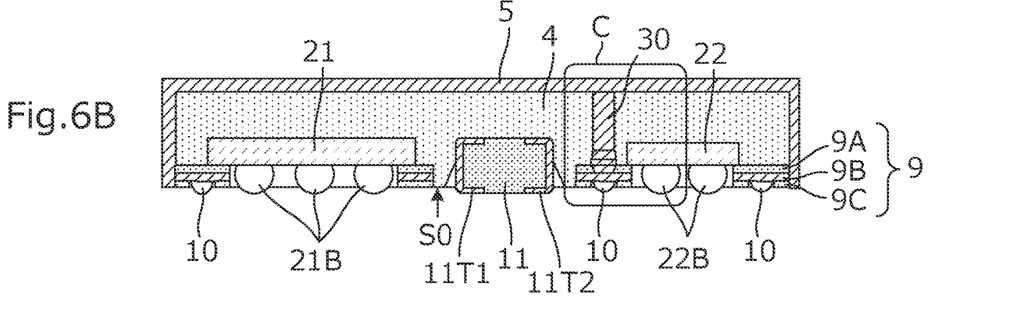
FIG. 6B is a cross-sectional view of an X-X portion in FIG. 6A.
Figure 6C:
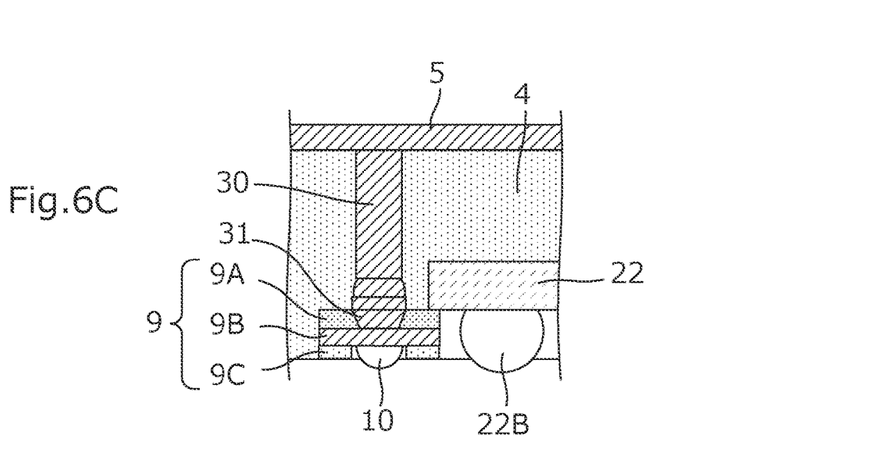
FIG. 6C is an enlarged view of a C portion in FIG. 6B.

FIG. 6A is a bottom view of an electronic component module 102A according to the second exemplary embodiment, FIG. 6B is a cross-sectional view of an X-X portion in FIG. 6A, and FIG. 6C is an enlarged view of a C portion in FIG. 6B.

The electronic component module 102A includes a plurality of components that each include a terminal and are placed along a plane, a frame substrate 9 that supports at least some components among the plurality of components, a sealing resin portion 4 that seals the plurality of components and a substrate, and a shield layer 5 that covers an outer surface of the sealing resin portion 4.

The electronic component module 102A includes bump components 21, 22, and 23 that include a bump as a terminal. The bump component 21 includes nine solder bumps 21B, and the bump component 22 includes four solder bumps 22B. In addition, the bump component 23 includes four solder bumps.

A plurality of ground bumps 10 are arrayed between the chip component 11 and the bump component 22 to form a ground bump array BA.

The electronic component module 102A is different from the electronic component module 101 shown in FIG. 1A and FIG. 1B in the first exemplary embodiment in that a conductive element 30 that is electrically connected to each ground bump 10 of the ground bump array BA is provided. The conductive element 30 is formed by filling a conductive material into a hole formed in the sealing resin portion 4. Alternatively, the conductive element 30 is formed by embedding a columnar conductor such as a metal pin, or a metal wire.

As shown in FIG. 6C, a via conductor 31 that is electrically connected to the ground layer 9B is formed on the insulating layer 9A of the frame substrate 9. A lower end of the conductive element 30 is electrically connected to the via conductor 31, and an upper end of the conductive element 30 is electrically connected to the shield layer 5. Therefore, the conductive element 30 and the via conductor 31 function as conductive pillars of ground potential. The chip component 11 and the bump component 22 are electromagnetically shielded by the conductive pillars. Similarly, the bump component 23 and the bump component 22 are electromagnetically shielded by the conductive pillars.

Figure 7:
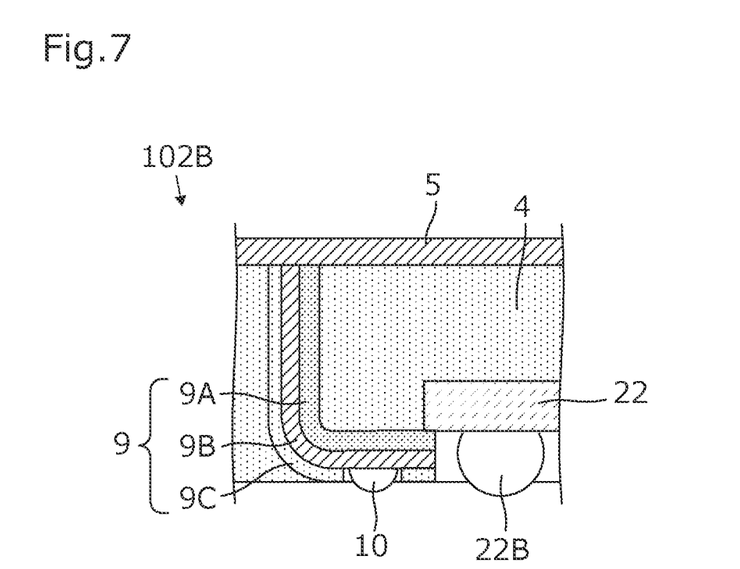
FIG. 7 is a partial cross-sectional view of another electronic component module 102B according to the second exemplary embodiment.

FIG. 7 is a partial cross-sectional view of another electronic component module 102B according to the second exemplary embodiment. In this example, the frame substrate 9 on which the ground bump 10 is formed is a flexible substrate and curves at a predetermined point, and the ground layer 9B of the frame substrate 9 is electrically connected to the top surface of the shield layer 5. Therefore, the ground layer 9B of the frame substrate 9 functions as a conductive wall of ground potential. In this manner, a conductor wall may be formed by a substrate.

Third Exemplary Embodiment

In a third exemplary embodiment, an electronic component module in which not only the terminal around of the chip component but a body portion is held by the sealing resin portion will be described.

Figure 8:
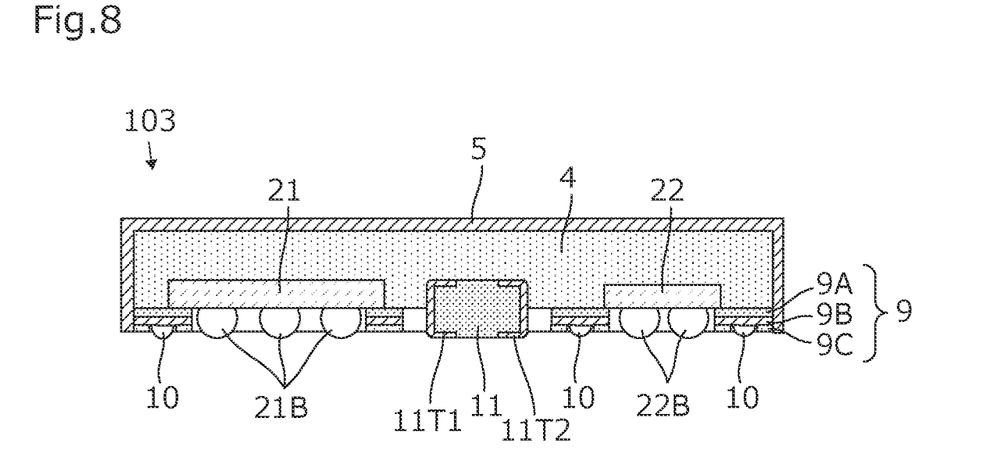
FIG. 8 is a cross-sectional view of an electronic component module 103 according to a third exemplary embodiment.

FIG. 8 is a cross-sectional view of an electronic component module 103 according to the third exemplary embodiment. The electronic component module 103 includes a plurality of components that each include a terminal and are placed along a plane, a frame substrate 9 that supports at least some components among the plurality of components, a sealing resin portion 4 that seals the plurality of components and a substrate, and a shield layer 5 that covers an outer surface of the sealing resin portion 4. Unlike the electronic component module 101 shown in FIG. 1B in the first exemplary embodiment, not only the periphery of the terminal but the body portion of the chip component 11 are sealed by the sealing resin portion 4.

Figure 9A:
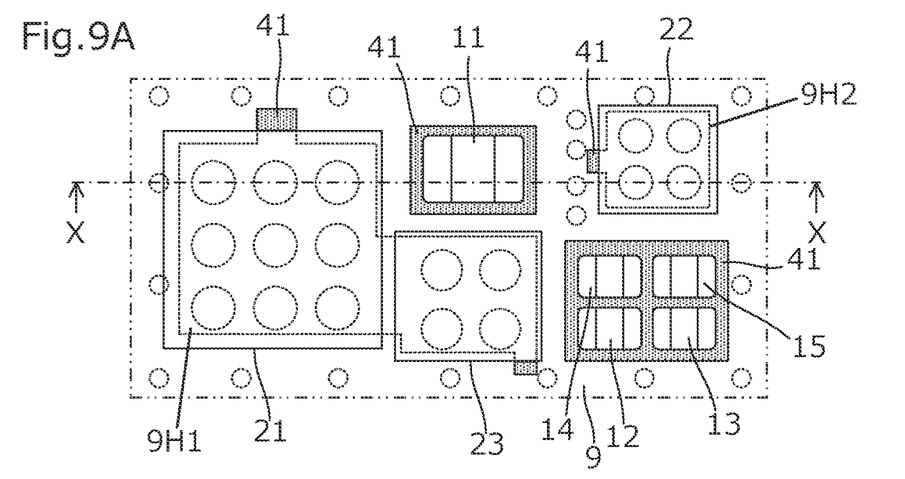
FIG. 9A is a plan view of the electronic component module 103 in the temporary sealing step.
Figure 9B:
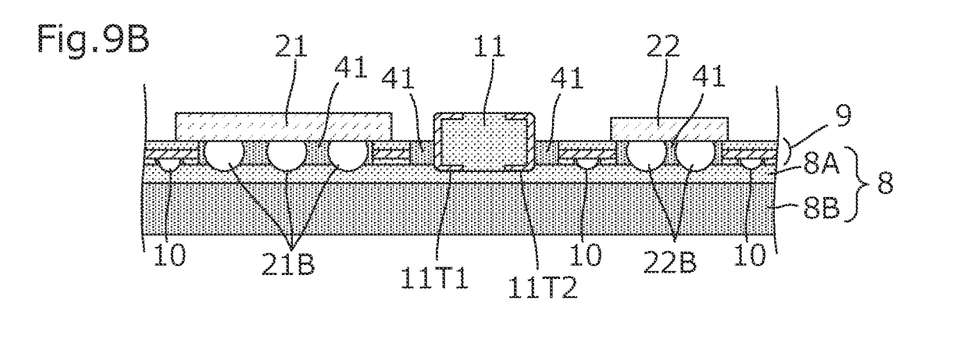
FIG. 9B is a cross-sectional view of an X-X portion in FIG. 9A.

FIG. 9A is a plan view of the electronic component module 103 in the temporary sealing step, and FIG. 9B is a cross-sectional view of an X-X portion in FIG. 9A. In the temporary sealing step, the opening of the frame substrate 9 is sealed by the temporary sealing material 41. Other configurations are preferably the same or substantially the same as the configurations shown in the first exemplary embodiment.

A thickness of the temporary sealing material 41 may be adjusted according to a height of the chip components 11 to 15. In a case of a chip component with a low height, in particular, setting the thickness of the temporary sealing material 41 to be small is able to ensure the degree of embedment of the chip component to the sealing resin portion 4, and prevent the chip component from coming off.

Fourth Exemplary Embodiment

In a fourth exemplary embodiment, an electronic component module in which the chip component is mounted on the frame substrate will be described.

Figure 10A:
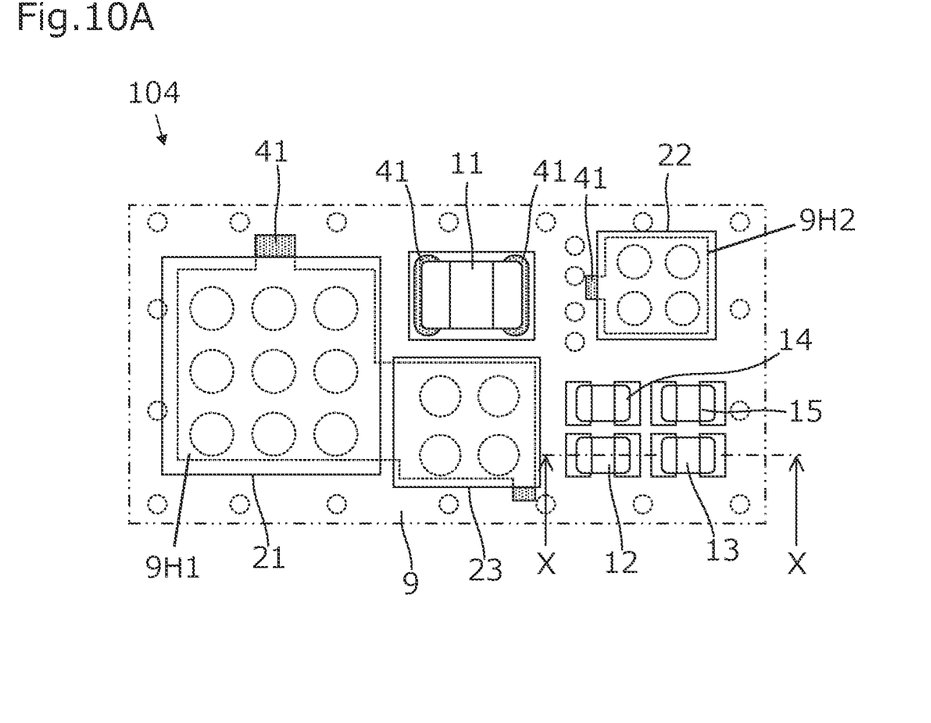
FIG. 10A is a plan view of an electronic component module 104 according to a fourth exemplary embodiment, in the temporary sealing step during manufacturing.
Figure 10B:
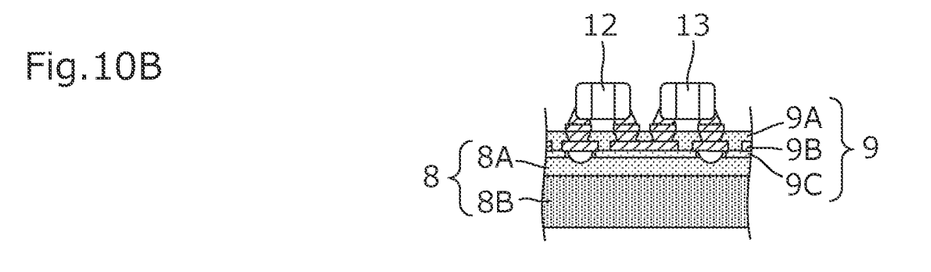
FIG. 10B is a cross-sectional view of an X-X portion in FIG. 10A.

FIG. 10A is a plan view of an electronic component module 104 according to the fourth exemplary embodiment, in the temporary sealing step during manufacturing. FIG. 10B is a cross-sectional view of an X-X portion in FIG. 10A. The chip components 12 to 15 are mounted on the frame substrate 9. An electrode for electrically connecting the chip components 12 to 15, a wiring layer, a via, and a bump are formed on the frame substrate 9. The wiring layer is insulated from the ground layer 9B of the frame substrate 9. The wiring layer may be formed on the same layer as the ground layer 9B or may be formed on a different layer. Other configurations are preferably the same or substantially the same as the configurations shown in the first exemplary embodiment.

In this manner, in a case in which the plurality of components include the chip components with a low height, the chip components 12 to 15 with a low height may be mounted on the frame substrate 9.

Fifth Exemplary Embodiment

In a fifth exemplary embodiment, an electronic component module in which one terminal of the chip component including both ends on which a terminal is formed is exposed from the sealing resin portion will be described. In addition, an electronic component module including a module component will be described.

Figure 11A:
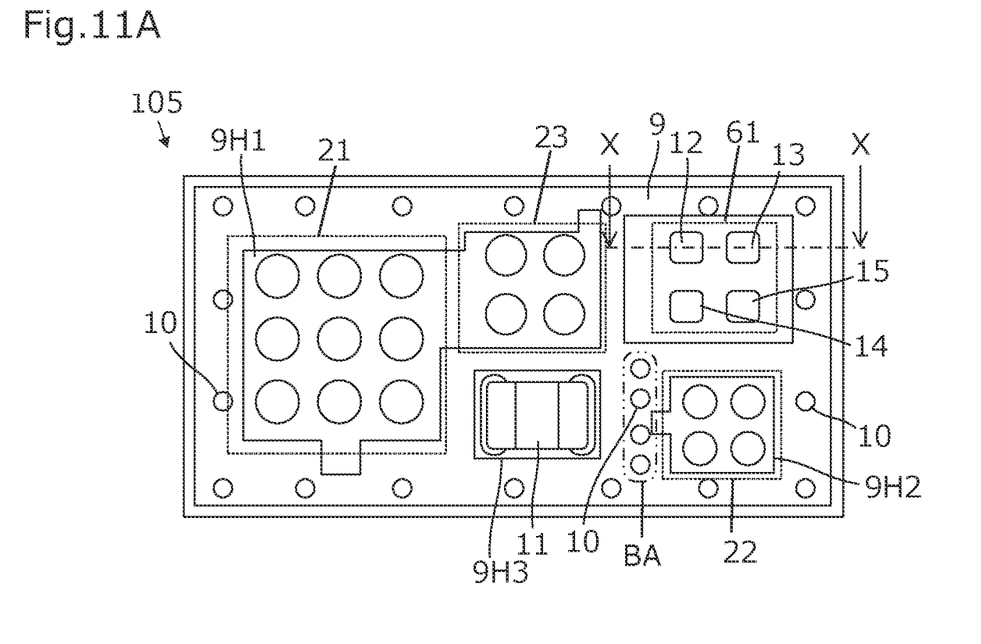
FIG. 11A is a bottom view of an electronic component module 105 according to a fifth exemplary embodiment.
Figure 11B:
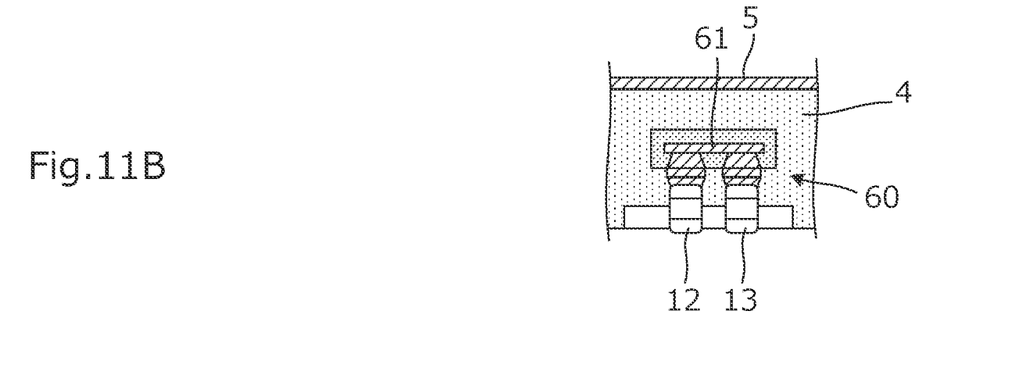
FIG. 11B is a cross-sectional view of an X-X portion in FIG. 11A.

FIG. 11A is a bottom view of an electronic component module 105 according to the fifth exemplary embodiment, and FIG. 11B is a cross-sectional view of an X-X portion in FIG. 11A. The electronic component module 105 is different from the electronic component module 101 shown in the first exemplary embodiment in that a module component 60 is provided. The module component 60 is configured by a module substrate 61 and the chip components 12 to 15 mounted on the module substrate 61. One terminal of each of the chip components 12 to 15 is mounted on an electrode of the module substrate 61 through the solder bump. Other configurations are preferably the same or substantially the same as the configurations shown in the first exemplary embodiment. In this manner, the component included in the electronic component module is not limited to a single component such as a chip component or a bump component and may be a module component. In addition, the component t included in the electronic component module 105 may have a structure in which one terminal of the chip components 12 to 15 in which a terminal is formed on the both ends is exposed from the sealing resin portion 4.

Finally, the present disclosure is not limited to the foregoing exemplary embodiments. Various modifications or changes can be appropriately made by those skilled in the art. The scope of the present disclosure is defined not by the foregoing exemplary embodiments but by the following claims. Furthermore, the scope of the present disclosure is intended to include all possible modifications or changes from the exemplary embodiments within the scopes of the claims and the scopes of equivalents.

BA—ground bump array
S0—plane
SL—slit
1—mounting board
4—sealing resin portion
4S—sealing resin layer
5—shield layer
8—adhesive sheet
8A—adhesive layer
8B—base material
9—frame substrate
9A—insulating layer
9B—ground layer
9C—resist layer
9H1, 9H2, 9H3, 9H4—opening
10—ground bump
11, 12, 13, 14, 15—chip component
11T1, 11T2—terminal
20—bump component
20B—solder bump
20C—constricted portion
21, 22, 23—bump component
21B, 22B—solder bump
30—conductive element
31—via conductor
41—temporary sealing material
60—module component
61—module substrate
81—dicing tape
100, 101, 102A, 102B, 103, 104, 105—electronic component module

The invention claimed is:
1. An electronic component module comprising:
a plurality of components, each of the plurality of components including a terminal;
a substrate supporting at least some components among the plurality of components;
a sealing resin portion sealing the plurality of components and the substrate; and
a shield layer covering an outer surface of the sealing resin portion, wherein:
the plurality of components include a bump component including a bump as the terminal;
the substrate includes an insulating layer, a ground layer, and a ground bump, wherein the ground bump being electrically connected to the ground layer;
the substrate includes an opening supporting chip component other than the bump of the bump component;

the ground layer of the substrate is exposed to a side surface of the substrate, and is electrically connected to the shield layer;

the terminal of each of the plurality of components and the ground bump are exposed while protruding from the sealing resin portion; and the terminal of each of the plurality of components and the ground bump protruding from the sealing resin portion are provided as mounting terminals of the electronic component module.

2. The electronic component module according to claim 1, wherein:

the at least some components supported by the substrate include the bump component including one surface on which a plurality of bumps are provided as the terminal; and a whole of the one surface of the bump component on which the plurality of bumps are provided is exposed from the sealing resin portion.

3. The electronic component module according to claim 1, wherein:

the plurality of components include the chip component including both ends on which the terminal is provided; and the terminal on the both ends of the chip component is exposed from the sealing resin portion.

4. The electronic component module according to claim 1, wherein the ground bump is provided between components of the plurality of components.

5. The electronic component module according to claim 4, wherein the substrate includes a conductive element electrically connected to the ground bump.

6. The electronic component module according to claim 1, wherein the chip component including both ends on which the terminal is provided is mounted on the substrate.

7. The electronic component module according to claim 1, wherein the plurality of components include a module component configured by a module substrate and a component mounted on the module substrate.

8. The electronic component module according to claim 1, wherein the substrate is provided by a wall supporting a periphery of the bump of the bump component, and including the opening overlapping with a surface on which the bump is provided.

9. The electronic component module according to claim 2, wherein:

the plurality of components include the chip component including both ends on which the terminal is provided; and the terminal on the both ends of the chip component is exposed from the sealing resin portion.

10. The electronic component module according to claim 2, wherein the ground bump is provided between components of the plurality of components.

11. The electronic component module according to claim 3, wherein the ground bump is provided between components of the plurality of components.

12. The electronic component module according to claim 2, wherein the chip component including both ends on which the terminal is provided is mounted on the substrate.

13. The electronic component module according to claim 3, wherein the chip component including both ends on which the terminal is provided is mounted on the substrate.

14. The electronic component module according to claim 4, wherein the chip component including both ends on which the terminal is provided is mounted on the substrate.

15. The electronic component module according to claim 5, wherein the chip component including both ends on which the terminal is provided is mounted on the substrate.

16. The electronic component module according to claim 2, wherein the plurality of components include a module component configured by a module substrate and a component mounted on the module substrate.

17. The electronic component module according to claim 3, wherein the plurality of components include a module component configured by a module substrate and a component mounted on the module substrate.

18. The electronic component module according to claim 4, wherein the plurality of components include a module component configured by a module substrate and a component mounted on the module substrate.

* * * * *